US012628588B2

(12) United States Patent
Inaba et al.

(10) Patent No.: US 12,628,588 B2
(45) Date of Patent: May 12, 2026

(54) WIRING FORMING METHOD AND SUBSTRATE PROCESSING APPARATUS

(71) Applicant: SCREEN Holdings Co., Ltd., Kyoto (JP)

(72) Inventors: Masaki Inaba, Kyoto (JP); Akihisa Iwasaki, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 215 days.

(21) Appl. No.: 18/269,536

(22) PCT Filed: Dec. 23, 2021

(86) PCT No.: PCT/JP2021/047788
§ 371 (c)(1),
(2) Date: Jun. 23, 2023

(87) PCT Pub. No.: WO2022/145329
PCT Pub. Date: Jul. 7, 2022

(65) Prior Publication Data
US 2024/0071774 A1 Feb. 29, 2024

(30) Foreign Application Priority Data
Dec. 28, 2020 (JP) ................................. 2020-219085

(51) Int. Cl.
*H10P 50/26* (2026.01)
*H10P 72/00* (2026.01)

(52) U.S. Cl.
CPC .......... *H10P 50/267* (2026.01); *H10P 50/269* (2026.01); *H10P 72/0421* (2026.01); *H10P 72/0604* (2026.01)

(58) Field of Classification Search
CPC ................. H10P 50/267; H10P 50/269; H10P 72/0421; H10P 72/0604
See application file for complete search history.

(56) References Cited

U.S. PATENT DOCUMENTS

| | | | |
|---|---|---|---|
| 5,284,547 A | 2/1994 | Watanabe | |
| 9,892,965 B2 | 2/2018 | Matsumoto | |

(Continued)

FOREIGN PATENT DOCUMENTS

| | | | |
|---|---|---|---|
| JP | H05-047717 A | | 2/1993 |
| JP | 2009043973 A | * | 2/2009 |

(Continued)

OTHER PUBLICATIONS

Request for Submission of an Opinion dated Jun. 17, 2024 in corresponding Korean Patent Application No. 10-2023-7021538 and a computer generated English translation obtained from the JPO.
Notice of Reasons for Refusal dated Jul. 16, 2024 in corresponding Japanese Patent Application No. 2020-219085 and a computer generated English translation obtained from the JPO.

(Continued)

*Primary Examiner* — Binh X Tran
(74) *Attorney, Agent, or Firm* — OSTROLENK FABER LLP

(57) ABSTRACT

A wiring forming method includes a loading step (Si), an etching step (S3), and a reducing step (S6). In the loading step (S1), a substrate having a metal wiring portion formed thereon is loaded into a chamber. In the etching step (S3), an oxidizing gas is supplied to the substrate to etch one part of the metal wiring portion. In the reducing step (S6), a reducing gas is supplied to the substrate to reduce an oxide film of the metal wiring portion formed by the etching step (S3).

10 Claims, 9 Drawing Sheets

(56)　　　References Cited

U.S. PATENT DOCUMENTS

| | | | | |
|---|---|---|---|---|
| 2005/0224456 A1 * | 10/2005 | Chen | .................. | B81C 1/00492 |
| | | | | 257/E21.582 |
| 2010/0025856 A1 | 2/2010 | Kawamura et al. | | |
| 2014/0361436 A1 * | 12/2014 | Matsumoto | ....... | H01L 23/53238 |
| | | | | 257/762 |
| 2015/0376792 A1 * | 12/2015 | Spurlin | ............ | H01J 37/32825 |
| | | | | 438/798 |
| 2017/0338122 A1 * | 11/2017 | Daulton | ............. | H01L 21/3065 |
| 2019/0096721 A1 | 3/2019 | Iwasaki et al. | | |
| 2019/0198389 A1 | 6/2019 | Ren et al. | | |
| 2020/0303207 A1 | 9/2020 | Higuchi et al. | | |

FOREIGN PATENT DOCUMENTS

| | | |
|---|---|---|
| JP | 2019-061978 A | 4/2019 |
| JP | 2019-106538 A | 6/2019 |
| JP | 2020-155615 A | 9/2020 |
| KR | 10-1923807 B1 | 11/2018 |
| KR | 10-2388695 B1 | 4/2022 |
| TW | 202015123 A | 4/2020 |
| WO | WO 2015/119760 A1 | 8/2015 |

OTHER PUBLICATIONS

Notice of Decision to Grant dated Jan. 8, 2025 in corresponding Korean Patent Application No. 10-2023-7021538.

International Preliminary Report on Patentability and Written Opinion dated Jul. 13, 2023 in corresponding International Application No. PCT/JP2021/047788 with English translation.

International Search Report mailed Feb. 15, 2022 in corresponding PCT International Application No. PCT/JP2021/047788.

Written Opinion mailed Feb. 15, 2022 in corresponding PCT International Application No. PCT/JP2021/047788.

Notice of Opinion for Examination By Intellectual Property Office, Ministry of Economic Affairs with Search Report dated Jul. 25, 2022 in corresponding Taiwan Patent Application No. 110149012 with machine English language translation made from the Japanese translation of the original communication.

Decision of Rejection By Intellectual Property Office, Ministry of Economic Affairs dated Feb. 16, 2023 in corresponding Taiwan Patent Application No. 110149012 with machine English language translation made from the Japanese translation of the original communication.

* cited by examiner

F I G. 4
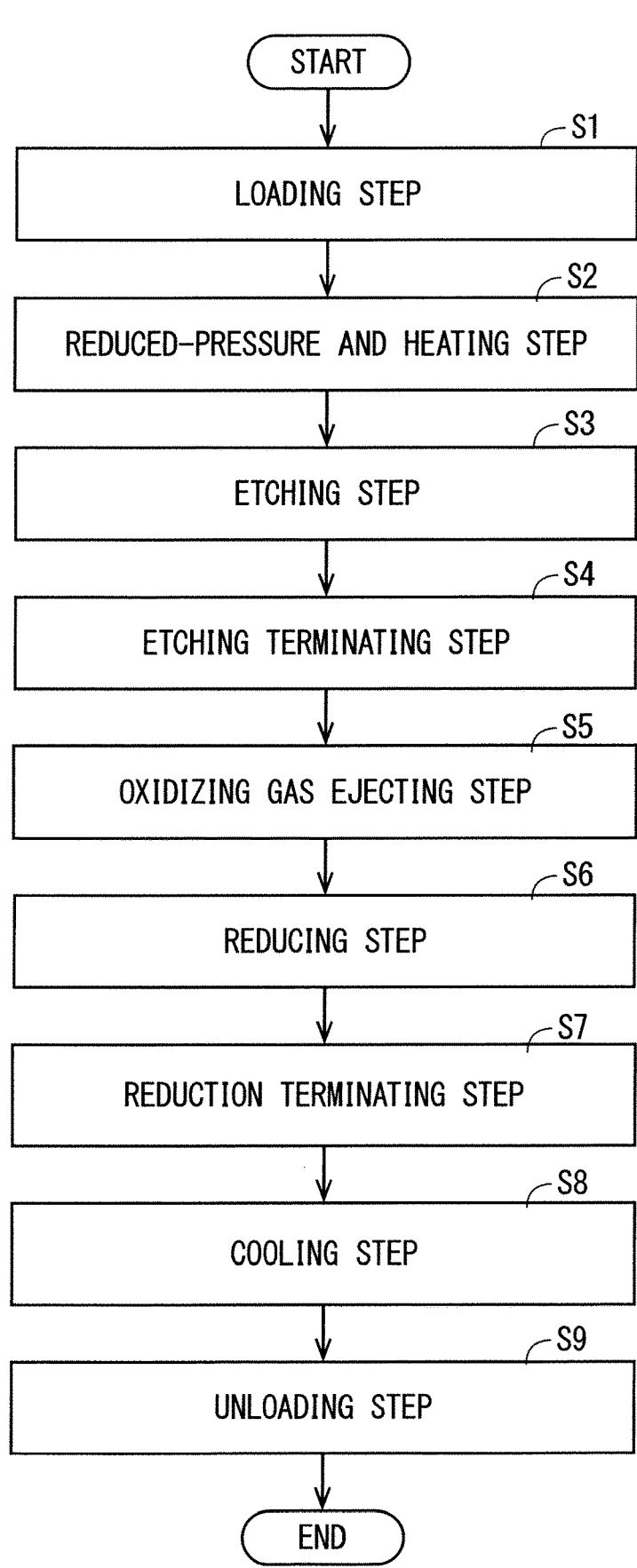

F I G. 7
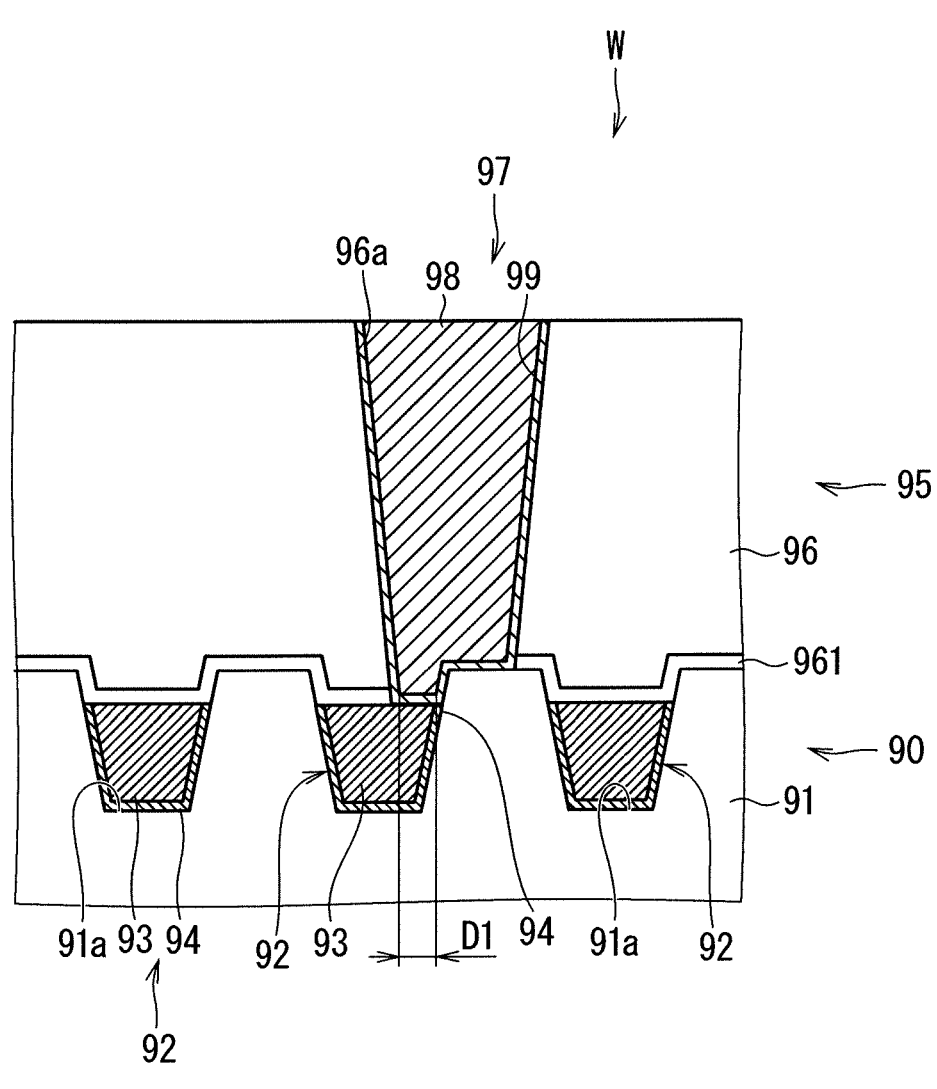

F I G. 1 0
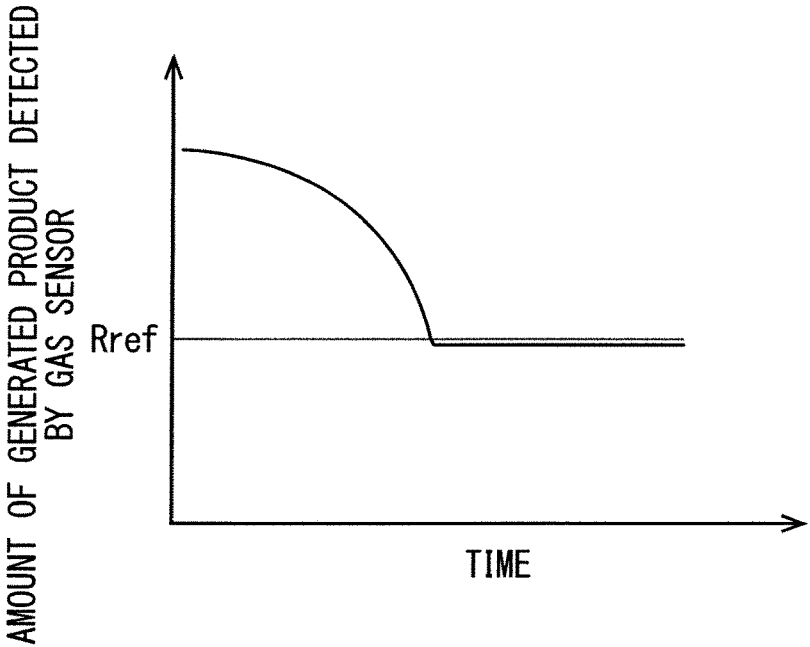
F I G. 1 1
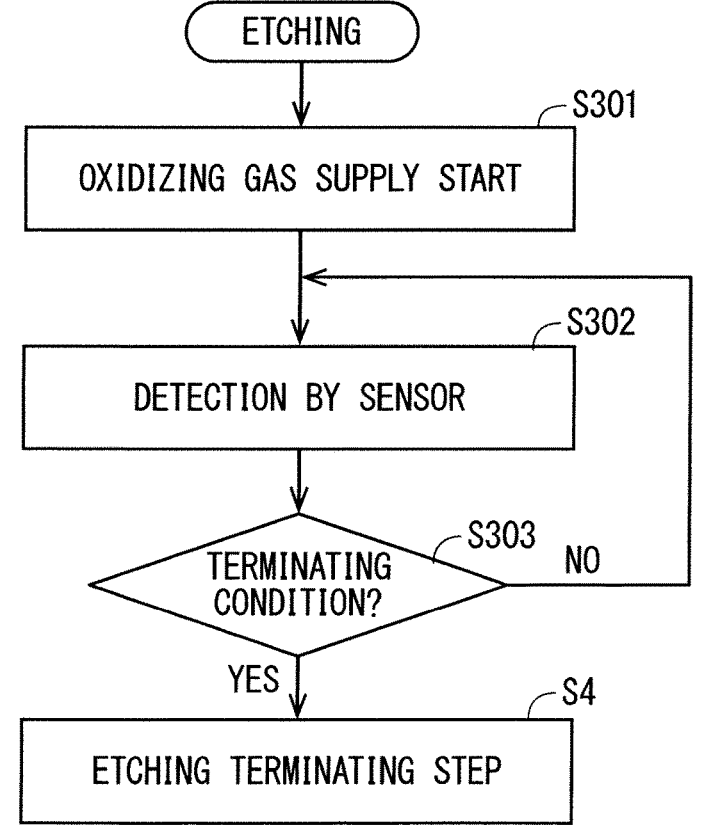

WIRING FORMING METHOD AND SUBSTRATE PROCESSING APPARATUS

CROSS-REFERENCE TO RELATED APPLICATIONS

The present application is a 35 U.S.C. §§ 371 national phase conversion of International Application No. PCT/JP2021/047788, filed Dec. 23, 2021, which claims priority to Japanese Patent Application No. 2020-219085, filed Dec. 28, 2020, the contents of both of which are incorporated herein by reference. The PCT International Application was published in the Japanese language.

TECHNICAL FIELD

The present application relates to a wiring forming method and a substrate processing apparatus.

BACKGROUND ART

Following the miniaturization of wiring in a semiconductor device, a short circuit between wiring becomes more likely to occur due to a deviation between the wiring and a via. That is, when a via formed on a certain first wiring is misaligned in a horizontal direction and one part of the via is also formed on an insulating film between the first wiring and a second wiring, a distance between the second wiring and the via is shortened, thus a short circuit can occur between the first wiring and the second wiring via the via.

A self-alignment via has been proposed as a method for solving this problem (for example, Patent Document 1). In Patent Document 1, a metal film (for example, a copper wiring) serving as a wiring is formed inside each trench formed in the insulating film, and by etching an upper surface of the metal film, the upper surface of each metal film is caused to retract further than an upper surface of the insulating film. As a result, it is possible to lengthen a distance between the upper surface of the metal film and the upper surface of the insulating film.

According to this, even when one part of the via is formed on the upper surface of the insulating film between a first metal film and a second metal film due to the via deviating from the first metal film in the horizontal direction, since the upper surface of the second metal film retracts further than the upper surface of the insulating film, it is possible to maintain a distance between the via and the second metal film. Accordingly, it is possible to suppress a short circuit between the first metal film and the second metal film via the via.

PRIOR ART DOCUMENT

Patent Document

Patent Document 1: Japanese Patent Application Laid-Open No. 2019-61978

SUMMARY

Problem to be Solved by the Invention

Wiring (hereinafter referred to as a metal wiring portion) formed on a substrate is formed of a single metal film, or is formed of a plurality of metal films. Such a metal wiring portion is etched as appropriate in a manufacturing step thereof to adjust a shape of the metal wiring portion. For example, in Patent Document 1, the upper surface of the metal film is etched.

In such etching, the metal wiring portion may be etched by oxidization. In this case, an oxide film may be partially formed on the metal wiring portion. Such an oxide film is not preferable as it increases a resistance value of the metal wiring portion.

Therefore, an object of the present application is to provide a technique capable of etching one part of the metal wiring portion by oxidation while suppressing an increase in the resistance value of the metal wiring portion due to the oxide film formed by oxidation.

Means to Solve the Problem

A first aspect of a wiring forming method is a method for forming a wiring including a loading step of loading a substrate having a metal wiring portion formed thereon in a chamber, an etching step of supplying an oxidizing gas to the substrate to etch one part of the metal wiring portion, and a reducing step of supplying a reducing gas to the substrate to reduce an oxide film of the metal wiring portion formed by the etching step.

A second aspect of a wiring forming method is the wiring forming method according to the first aspect, in which the metal wiring portion includes a wiring main body positioned in a trench of an insulating film in the substrate, and a barrier film provided between the wiring main body and the insulating film, in the etching step, one part of the barrier film is etched as the one part of the metal wiring portion, and in the reducing step, the oxide film formed on the wiring main body by the etching step is reduced.

A third aspect of the wiring forming method is the wiring forming method according to the second aspect, in which, in the etching step, a projecting portion of the barrier film projecting from a surface of the wiring main body is etched as the one part of the metal wiring portion, and in the reducing step, the oxide film formed on the surface of the wiring main body by the etching step is reduced.

A fourth aspect of the wiring forming method is the wiring forming method according to the second or third aspect, in which the barrier film includes ruthenium.

A fifth aspect of the wiring forming method is the wiring forming method according to any one of the second to fourth aspects, in which the wiring main body includes at least any one of copper, molybdenum, cobalt, tungsten, platinum, and indium.

A sixth aspect of the wiring forming method is the wiring forming method according to the first aspect, in which the metal wiring portion includes a metal film, in the etching step, one part of the metal film is etched by the oxidizing gas as the one part of the metal wiring portion, and in the reducing step, the oxide film formed on the metal film by the etching step is reduced by the reducing gas.

A seventh aspect of the wiring forming method is the wiring forming method according to any one of the first to sixth aspects, in which the etching step includes a detecting step of detecting a generated gas generated by a reaction between the oxidizing gas and the metal wiring portion by a gas sensor, and a determination step of determining whether to terminate the etching step based on a detection value of the gas sensor.

An eighth aspect of the wiring forming method is the wiring forming method according to any one of the first to seventh aspects, including an oxidizing gas ejecting step performed between the etching step and the reducing step that supplies an inert gas into the chamber to discharge the oxidizing gas from the chamber.

A ninth aspect of the wiring forming method is the wiring forming method according to any one of the first to eighth aspects, in which, in the etching step, a first step of supplying the oxidizing gas and a second step of supplying the inert gas are alternately repeated.

A tenth aspect of the wiring forming method is the wiring forming method according to any one of the first to ninth aspects, in which, in the etching step, the substrate is heated so that a temperature of the substrate is 50 degrees or more and 200 degrees or less.

An eleventh aspect of the wiring forming method is the wiring forming method according to any one of the first to tenth aspects, in which, in the reducing step, the substrate is heated so that a temperature of the substrate is 100 degrees or more and 300 degrees or less.

A twelfth aspect of the wiring forming method is the wiring forming method according to any one of the first to eleventh aspects, further including a cooling step of cooling the substrate after the reducing step and an unloading step of unloading the substrate from the chamber after the cooling step.

An aspect of the substrate processing apparatus is a substrate processing apparatus including a chamber, a substrate holder provided in the chamber that holds a substrate having a metal wiring portion formed thereon, an oxidizing gas supply unit that supplies an oxidizing gas to the substrate in the chamber to etch one part of the metal wiring portion, and a reducing gas supply unit that supplies a reducing gas to the substrate to reduce an oxide film of the metal wiring portion formed by the oxidizing gas.

Effects of the Invention

According to the first to twelfth aspects of the wiring forming method and the aspect of the substrate processing apparatus, since the oxide film of the metal wiring portion produced in the etching step is reduced, it is possible to cause the oxide film to once again function as the metal wiring portion. Accordingly, it is possible to decrease the resistance value of the metal wiring portion.

According to the third aspect of the wiring forming method, in the etching step, the projecting portion of the barrier film is removed by etching. Accordingly, when a via portion is formed on the insulating film, the via portion and the metal wiring portion can be formed with a lower resistance.

According to the fourth aspect of the wiring forming method, a ruthenium tetroxide gas is generated by oxidation, which contributes to the etching of the barrier film.

According to the sixth aspect of the wiring forming method, the resistance value of the metal film can be reduced.

According to the seventh aspect of the wiring forming method, an amount of etching on the metal wiring portion can be controlled with higher accuracy.

According to the eighth aspect of the wiring forming method, the reducing gas is supplied after a concentration of the oxidizing gas is decreased. Accordingly, it is possible to suppress the reaction between the reducing gas and the oxidizing gas, and it is possible to suppress or avoid a decrease in an amount of the reducing gas acting on the substrate.

According to the ninth aspect of the wiring forming method, by supplying the inert gas in the second step, the concentration of the oxidizing gas becomes uneven. Accordingly, after reacting with the substrate, the oxidizing gas is quickly separated from the substrate due to concentration diffusion. In the subsequent first step, since fresh oxidizing gas is once again supplied to the substrate, the old oxidizing gas is easily replaced with the new oxidizing gas, and the new oxidizing gas is likely to act on the substrate. As a result, etching can be performed more quickly.

According to the tenth aspect of the wiring forming method, the metal wiring portion can be etched more appropriately.

According to the eleventh aspect of the wiring forming method, oxide can be reduced more appropriately.

According to the twelfth aspect of the wiring forming method, it is possible to suppress natural oxidation of the substrate outside the chamber.

BRIEF DESCRIPTION OF DRAWINGS

FIG. 4 is a flowchart illustrating an example of an operation of the substrate processing apparatus.

FIG. 7 is a cross-sectional view schematically illustrating an example of a configuration of the substrate having a connection layer formed thereon.

FIG. 10 is a graph schematically illustrating an example of a temporal change of a generated gas.

FIG. 11 is a flowchart illustrating an example of a specific operation of the etching step.

DESCRIPTION OF EMBODIMENTS

Figure 1:
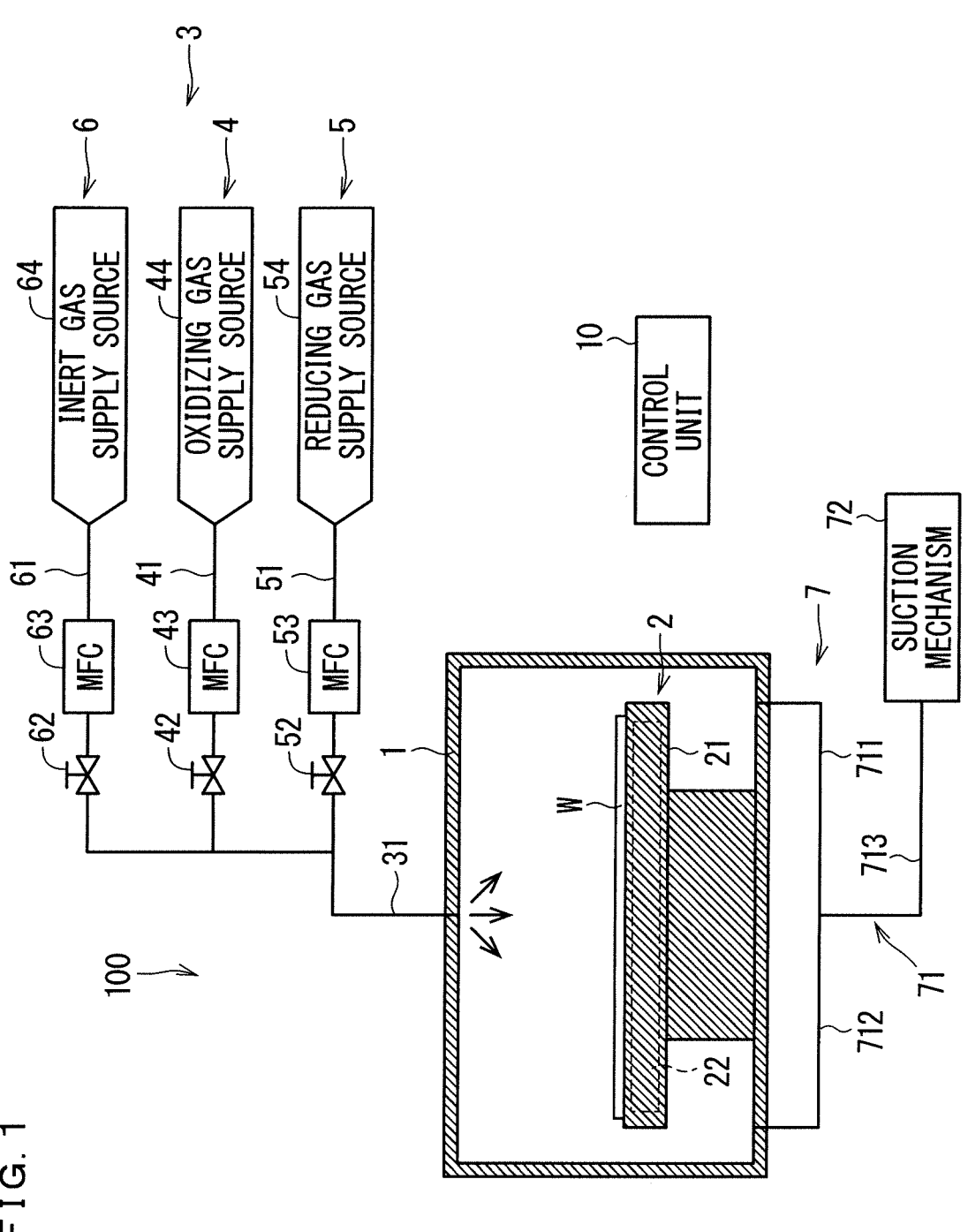
FIG. 1 is a diagram schematically illustrating an example of a configuration of a substrate processing apparatus according to a first embodiment.

Hereinafter, the embodiments will be described with reference to the accompanying drawings. Note that the constituent elements described in the present embodiments are merely illustrative, and the scope of the present disclosure is not intended to be only limited thereto. In the drawings, the dimensions or quantities of each component may be illustrated in an exaggerated or simplified manner as necessary to aid understanding.

Unless otherwise specified, expressions indicating a relative or absolute positional relationship (for example, "in one direction", "along one direction", "parallel", "orthogonal", "central", "concentric", "coaxial", etc.) do not only strictly indicate the positional relationship, but also represent a state where the positional relationship is relatively displaced in terms of an angle or a distance in a range within which a tolerance or an equivalent function can be obtained. Unless otherwise specified, expressions indicating an equal state (for example, "same", "equal", "homogeneous", etc.) do not only strictly indicate a state of being quantitatively equal, but also include a state where there is a difference by which a tolerance or an equivalent function can be obtained. Unless otherwise specified, expressions indicating shapes (for example, "quadrangular" or "cylindrical", etc.) do not only strictly indicate the shape geometrically, but also indicate a shape having, for example, unevenness or chamfering in a range within which an equivalent function can be obtained. The expressions "comprising", "equipped with", "possessing", "including", or "having" one constituent element are not exclusive expressions excluding the presence of other constituent elements. The expression "at least any one of A, B, and C" includes only A, only B, or only C, any two of A, B, and C, or all of A, B, and C.

First Embodiment

<Outline of Substrate Processing Apparatus>

FIG. 1 is a diagram schematically illustrating an example of a configuration of a substrate processing apparatus 100 according to a first embodiment. The substrate processing apparatus 100 is used when wiring is formed on a substrate W.

Figure 2:
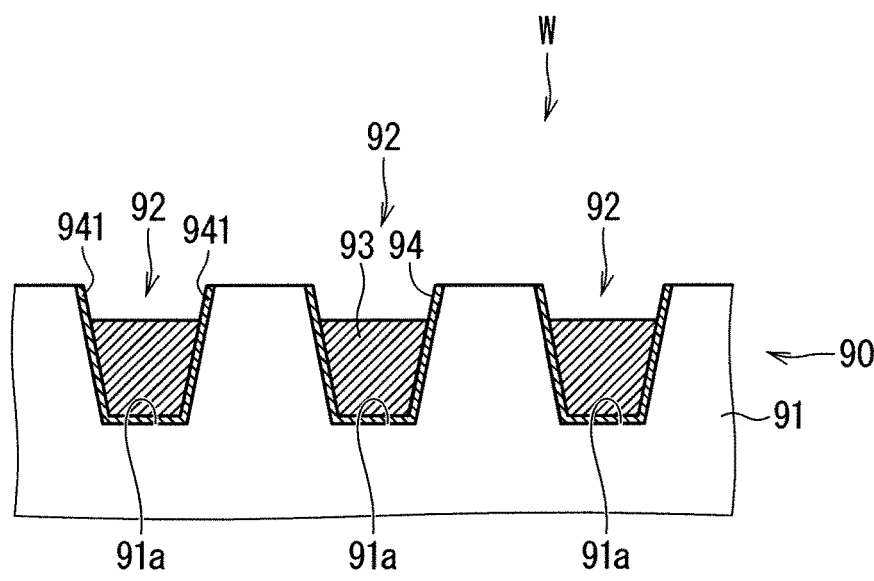
FIG. 2 is a cross-sectional view schematically illustrating an example of a configuration of a substrate.

FIG. 2 is a cross-sectional view schematically illustrating an example of a configuration of the substrate W to be loaded in the substrate processing apparatus 100. The substrate W in FIG. 2 is a substrate W before being carried the substrate into processing apparatus 100. A first wiring layer 90 is formed on the substrate W. The first wiring layer 90 includes an insulating film 91 and a metal wiring portion 92. The insulating film 91 is also called an interlayer insulating film, and ensures insulation between the metal wiring portion 92 and a periphery. The insulating film 91 may be, for example, a low dielectric film (a so-called low-k film). As a more specific example of the low dielectric film, it is possible to employ a SiOC film obtained by adding carbon to silicon oxide.

In the example of FIG. 2, a trench 91a is formed on an upper surface of the insulating film 91. The trench 91a is a groove formed on the upper surface of the insulating film 91. In the example of FIG. 2, a plurality of trenches 91a are arranged so as to be mutually spaced apart in intervals. A pitch between the trenches 91a is, for example, approximately 20 nm or more and 40 nm or less.

The metal wiring portion 92 is embedded in each trench 91a. In the example of FIG. 2, the metal wiring portion 92 includes a wiring main body 93 and a barrier film 94. The wiring main body 93 is formed of a metallic material. A material forming an oxide film by oxidation is employed as the metallic material. More specifically, at least any one of, for example, copper (Cu), molybdenum (Mo), cobalt (Co), tungsten (W), platinum (Pt), and indium (Ir) can be employed as the metallic material.

The wiring main body 93 is located in the trench 91a. The barrier film 94 is provided between the wiring main body 93 and the insulating film 91 and suppresses diffusion of the wiring main body 93 into the insulating film 91. The barrier film 94 adheres closely to a surface of the insulating film 91 in the trench 91a while also adhering closely to the wiring main body 93. A material of the barrier film 94 differs from a material of the wiring main body 93, and a metallic material capable of suppressing diffusion of the wiring main body 93 into the insulating film 91 is employed as the material of the barrier film 94. In addition, a material to be etched by oxidation is employed as the metallic material of the barrier film 94. More specifically, ruthenium (Ru), for example, can be employed as the metallic material. The barrier film 94 can also be referred to as a barrier metal.

The barrier film 94 is formed along a side surface and a bottom surface of the trench 91a. Accordingly, the barrier film 94 has a similar shape to a shape of the trench 91a, having a concave shape. The wiring main body 93 is embedded in a recessed portion of the barrier film 94.

A thickness of the barrier film 94 is, for example, approximately several nm (for example, 2 nm) or less. Since the barrier film 94 is extremely thin, a main component of the metal wiring portion 92 is the wiring main body 93. Accordingly, a material having a specific resistance value smaller than a specific resistance value of the barrier film 94 may be employed as the material of the wiring main body 93. As a result, the resistance value of the metal wiring portion 92 can be reduced. For example, since a specific resistance value of copper is extremely small, when copper having a small specific resistance value is employed as the material of the wiring main body 93, the resistance value of the metal wiring portion 92 can be reduced. The wiring main body 93 can also be referred to as a plug.

In the example of FIG. 2, an upper surface of the wiring main body 93 retreats further than the upper surface of the insulating film 91. In other words, a portion of the insulating film 91 between the trenches 91a projects further upward than the wiring main body 93.

On the other hand, an upper end of the barrier film 94 is substantially flush with the upper surface of the insulating film 91. Hereinafter, the portions of the barrier film 94 projecting further upward than the upper surface of the wiring main body 93 is referred to as projecting portions 941. Since a cross-section of the barrier film 94 has a substantial U shape, portions on both sides thereof project further upward than the wiring main body 93 as the projecting portions 941.

Here, the substrate processing apparatus 100 etches the projecting portions 941 of the barrier film 94. Referring to FIG. 1, the substrate processing apparatus 100 includes a chamber 1, a substrate holder 2, a gas supply unit 3, and a control unit 10.

The chamber 1 has a hollowed-out box shape. An internal space of the chamber 1 corresponds to a processing space where processing on the substrate W is performed.

As illustrated in FIG. 1, the substrate processing apparatus 100 may be provided with a suction unit 7. The suction unit 7 sucks gases in the chamber 1 and discharges the gases outside to reduce the pressure in the chamber 1. The suction unit 7 adjusts the pressure in the chamber 1 so that the pressure in the chamber 1 is within a pressure range suitable for processing.

The substrate holder 2 is provided in the chamber 1, and holds the substrate W in, for example, a horizontal position. The horizontal position mentioned here is a position in which a thickness direction of the substrate W extends along the vertical direction. Since the insulating film 91 and the metal wiring portion 92 are formed on an upper surface of the substrate W held by the substrate holder 2, the insulating film 91 and the metal wiring portion 92 are exposed in the chamber 1.

In the example of FIG. 1, the substrate processing apparatus 100 further includes a heater 22. The heater 22 is provided in the chamber 1 and heats the substrate W held by the substrate holder 2. The heater 22 heats the substrate W so that a temperature of the substrate W is within a temperature range suitable for processing.

The gas supply unit 3 supplies various gases into the chamber 1. As shown in FIG. 1, the gas supply unit 3 includes an oxidizing gas supply unit 4 and a reducing gas supply unit 5. The oxidizing gas supply unit 4 supplies an oxidizing gas to the substrate W in the chamber 1. The oxidizing gas is, for example, a gas including oxygen, and a more specific example thereof is an ozone gas. When the oxidizing gas acts on the upper surface of the substrate W, the projecting portions 941 of the barrier film 94 are etched. In other words, the barrier film 94 is formed of a material to be etched by oxidation. For example, when the barrier film 94 is ruthenium, a ruthenium tetroxide (Rua') gas is generated by a reaction between an oxidizing gas, such as ozone, and ruthenium, and the projecting portions 941 are etched.

On the other hand, when the oxidizing gas acts on the upper surface of the substrate W, an oxide film is formed on the wiring main body 93. In other words, the wiring main body 93 is formed of a material that forms the oxide film by oxidation. For example, when the wiring main body 93 is copper, a thin copper oxide film is formed on the upper surface thereof. As a result, a cross-sectional area of the wiring main body 93 decreases, and the resistance value of the wiring main body 93 increases.

Therefore, the reducing gas supply unit 5 supplies a reducing gas to the substrate W in the chamber 1. The reducing gas is, for example, a gas including hydrogen, and a more specific example thereof is a hydrogen gas. The reducing gas supply unit 5 may supply a carrier gas together with the hydrogen gas. The carrier gas is, for example, an inert gas such as nitrogen or the like. A forming gas can be employed as a mixed gas of the hydrogen gas and the inert gas. A proportion of the hydrogen gas in the forming gas is, for example, approximately 3% to 4%. When the reducing gas acts on the upper surface of the substrate W, the oxide film formed on the wiring main body 93 is reduced and returns to one part of the wiring main body 93. As a result, it is possible to suppress or avoid a decrease in the cross-sectional area of the wiring main body 93 due to the oxide film, and it is possible to suppress or avoid an increase in the resistance value of the wiring main body 93.

As described above, according to the substrate processing apparatus 100, it is possible to etch the projecting portions 941 of the barrier film 94 by supplying the oxidizing gas. On the other hand, the oxide film is formed on the surface of the wiring main body 93 by the supply of the oxidizing gas. Thus, the oxide film of the wiring main body 93 can be reduced by the subsequent supply of reducing gas. Accordingly, the oxide film can be restored to one part of the wiring main body 93. That is, it is possible to cause the oxide film to once again function as the wiring main body 93. Consequently, it is possible to suppress or avoid an increase in the resistance value of the metal wiring portion 92.

Next, a specific example of each configuration of the substrate processing apparatus 100 and a specific example of the operation of the substrate processing apparatus 100 will be described in detail.

<Substrate Holder>

In the example of FIG. 1, the substrate holder 2 includes a mounting table 21. The substrate W is mounted on the mounting table 21 in the horizontal position. The upper surface of the substrate W (specifically, the upper surface of the insulating film 91 and the upper surface of the metal wiring portion 92) is exposed in the chamber 1 in a state where the substrate W is mounted via the mounting table 21.

<Heater>

The heater 22 is controlled by the control unit 10 and heats the substrate W in the chamber 1. In the example of FIG. 1, the heater 22 is provided vertically below the substrate W held by the substrate holder 2. In the example of FIG. 1, the heater 22 is built in the mounting table 21. The heater 22 may be, for example, an electric resistance type heater including an electric heating wire, or it may be an optical type heater including a light source for emitting a light for heating.

<Suction Unit>

The suction unit 7 sucks gases into the chamber 1. In the example of FIG. 1, the suction unit 7 includes a suction pipe 71 and a suction mechanism 72. An upstream end of the suction pipe 71 is connected to the chamber 1. In the example of FIG. 1, the suction pipe 71 includes branch pipes 711, 712 and a junction pipe 713. An upstream end of the branch pipe 711 and an upstream end of the branch pipe 712 are connected to the chamber 1 vertically below the substrate W held by the substrate holder 2. In the example of FIG. 1, the upstream end of the branch pipe 711 and the upstream end of the branch pipe 712 are connected to the bottom portion of the chamber 1 on mutually opposite sides with respect to the substrate holder 2.

A downstream end of the branch pipe 711 and a downstream end of the branch pipe 712 are jointly connected to the upstream end of the junction pipe 713, and a downstream end of the junction pipe 713 is connected to the suction mechanism 72. The suction mechanism 72 is, for example, a pump. The suction mechanism 72 is controlled by the control unit 10 and sucks gases in the chamber 1 through the suction pipe 71.

<Gas Supply Unit>

The gas supply unit 3 includes a supply pipe 31. A downstream end of the supply pipe 31 is connected to the chamber 1. In the example of FIG. 1, the downstream end of the supply pipe 31 is connected to a ceiling portion of the chamber 1 and faces the substrate W held by the substrate holder 2 in the vertical direction. The downstream end of the supply pipe 31 functions as an air supply port for supplying gases into the chamber 1. In the example of FIG. 1, various gases are supplied into the chamber 1 from the air supply port of the supply pipe 31, and each gas flows toward the upper surface of the substrate W.

In the example of FIG. 1, the oxidizing gas supply unit 4 supplies the oxidizing gas into the chamber 1 through the supply pipe 31. For example, the oxidizing gas supply unit 4 includes a supply pipe 41, a valve 42, and a flow rate adjusting unit 43. A downstream end of the supply pipe 41 is connected to the supply pipe 31, and an upstream end of the supply pipe 41 is connected to an oxidizing gas supply source 44. The oxidizing gas supply source 44 supplies the oxidizing gas to the downstream end of the supply pipe 41.

The valve 42 is interposed in the supply pipe 41. The valve 42 is controlled by the control unit 10, and when the valve 42 opens, the oxidizing gas is supplied from the oxidizing gas supply source 44 into the chamber 1 through the supply pipe 41 and the supply pipe 31. When the valve 42 closes, the supply of the oxidizing gas is terminated.

The flow rate adjusting unit 43 is interposed in the supply pipe 41. The flow rate adjusting unit 43 is controlled by the control unit 10 to adjust a flow rate of the oxidizing gas flowing through the supply pipe 41. The flow rate adjusting unit 43 is, for example, a mass flow controller.

In the example of FIG. 1, the reducing gas supply unit 5 supplies the reducing gas into the chamber 1 through the supply pipe 31. For example, the reducing gas supply unit includes a supply pipe 51, a valve 52, and a flow rate adjusting unit 53. A downstream end of the supply pipe 51 is connected to the supply pipe 31, and an upstream end of the supply pipe 51 is connected to a reducing gas supply source 54. The reducing gas supply source 54 supplies the reducing gas to the downstream end of the supply pipe 51.

The valve 52 is interposed in the supply pipe 51. The valve 52 is controlled by the control unit 10, and when the valve 52 opens, the reducing gas is supplied from the reducing gas supply source 54 into the chamber 1 through the supply pipe 51 and the supply pipe 31. When the valve 52 closes, the supply of the reducing gas is terminated.

The flow rate adjusting unit 53 is interposed in the supply pipe 51. The flow rate adjusting unit 53 is controlled by the control unit 10 to adjust a flow rate of the reducing gas flowing through the supply pipe 51. The flow rate adjusting unit 53 is, for example, a mass flow controller.

In the example of FIG. 1, the gas supply unit 3 further includes an inert gas supply unit 6. The inert gas supply unit 6 supplies an inert gas into the chamber 1. The inert gas includes, for example, at least any one of a rare gas such as argon or the like, and a nitrogen gas.

In the example of FIG. 1, the inert gas supply unit 6 supplies the inert gas into the chamber 1 through the supply pipe 31. For example, the inert gas supply unit 6 includes a supply pipe 61, a valve 62, and a flow rate adjusting unit 63. A downstream end of the supply pipe 61 is connected to the supply pipe 31, and an upstream end of the supply pipe 61 is connected to an inert gas supply source 64. The inert gas supply source 64 supplies the inert gas to the downstream end of the supply pipe 61.

The valve 62 is interposed in the supply pipe 61. The valve 62 is controlled by the control unit 10, and when the valve 62 opens, the inert gas is supplied from the inert gas supply source 64 into the chamber 1 through the supply pipe 61 and the supply pipe 31. When the valve 62 closes, the supply of the inert gas is terminated.

The flow rate adjusting unit 63 is interposed in the supply pipe 61. The flow rate adjusting unit 63 is controlled by the control unit 10 to adjust a flow rate of the inert gas flowing through the supply pipe 61. The flow rate adjusting unit 63 is, for example, a mass flow controller.

<Control Unit>

Figure 3:
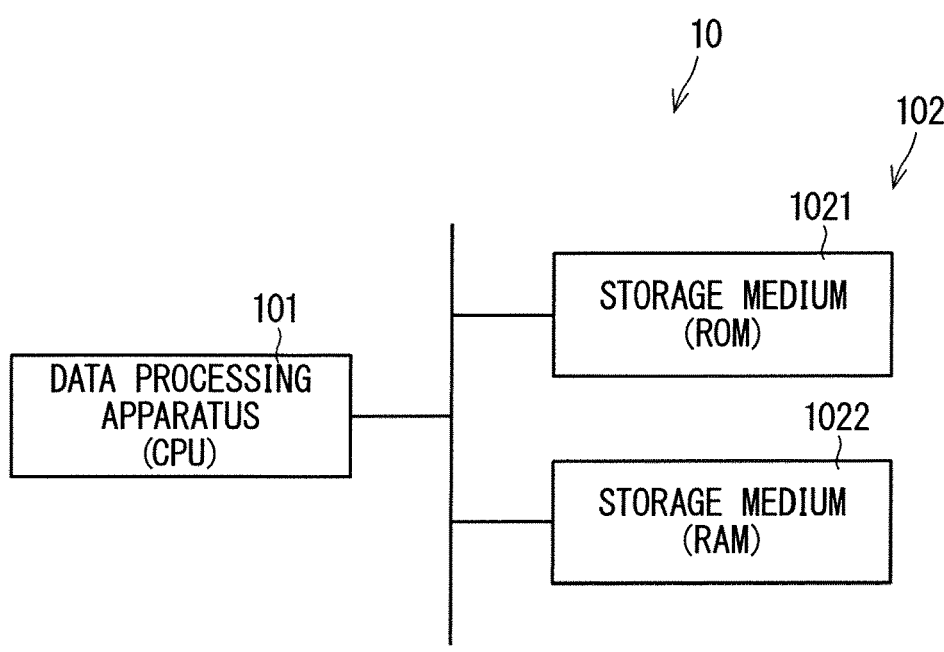
FIG. 3 is a block diagram illustrating an example of an internal configuration of a control unit.

FIG. 3 is a block diagram schematically illustrating an example of a configuration of the control unit 10. The control unit 10 is an electronic circuit device, and may have, for example, a data processing apparatus 101 and a storage medium 102. The data processing apparatus 101 may be, for example, an arithmetic processing apparatus such as a central processor unit (CPU) or the like. The storage medium 102 may have a non-transitory storage medium 1021 (for example, a read only memory (ROM) or a hard disk) and a transitory storage medium 1022 (for example, a random access memory (RAM)). The non-transitory storage medium 1021 may store, for example, a program for defining processing to be executed by the control unit 10. When the data processing apparatus 101 executes this program, the control unit 10 can execute the processing defined in the program. Of course, one part of, or the entire processing to be executed by the control unit 10 may be executed by a hardware circuit, such as a logic circuit or the like.

<Operation of Substrate Processing Apparatus>

Next, an example of the operation of the substrate processing apparatus 100 will be described. FIG. 4 is a flowchart illustrating an example of the operation of the substrate processing apparatus 100. In other words, FIG. 4 is a flowchart illustrating an example of the wiring forming method.

First, the substrate W is conveyed into the chamber 1 by a conveyer (not illustrated) (step S1: loading step). As a result, the substrate W is mounted on the mounting table 21 of the substrate holder 2. The insulating film 91 and the metal wiring portion 92 are formed on the upper surface of the substrate W.

Next, the suction unit 7 sucks gases into the chamber 1, and the heater 22 heats the substrate W (step S2: reduced-pressure heating step). Specifically, the control unit 10 causes the suction mechanism 72 to perform a suction operation and causes the heater 22 to perform a heating operation.

When the suction mechanism 72 performs the suction operation, the gas in the chamber 1 is sucked toward the suction mechanism 72 through the suction pipe 71, thus decreasing the pressure in the chamber 1. The suction unit 7 adjusts the pressure in the chamber 1 to a predetermined process pressure suitable for processing. The predetermined process pressure is, for example, 400 Torr or more and 760 Torr or less. Note that 760 Torr represents the standard atmospheric pressure. That is, the suction unit 7 does not need to be provided, and pressure reduction in the chamber 1 is not an essential step.

When reducing pressure in the chamber 1, the substrate processing apparatus 100 may be provided with a pressure sensor for measuring the pressure in the chamber 1, and in this case, the control unit 10 may control the suction mechanism 72 based on a detection value of the pressure sensor. The suction unit 7 adjusts the pressure in the chamber 1 until processing is complete.

When the heater 22 performs the heating operation, the temperature of the substrate W increases. The heater 22 adjusts the temperature of the substrate W so that the temperature of the substrate W is a first predetermined temperature suitable for etching the metal wiring portion 92. The first predetermined temperature is, for example, 50° C. or more and 200° C. or less. The substrate processing apparatus 100 may be provided with a temperature sensor for detecting the temperature of the substrate W, and in this case, the control unit 10 may control the heater 22 based on a detection value of the temperature sensor. The heater 22 adjusts the temperature of the substrate W until processing is complete.

Next, the oxidizing gas supply unit 4 supplies the oxidizing gas into the chamber 1 (step S3: etching step). Specifically, the control unit 10 opens the valve 42. As a result, the oxidizing gas is supplied into the chamber 1 from the oxidizing gas supply source 44 through the supply pipe 41 and the supply pipe 31, and flows inside the chamber 1 toward the substrate W. Here, the oxidizing gas is an ozone gas.

When the oxidizing gas acts on the upper surface of the substrate W, the barrier film 94 is oxidized and etched. Specifically, the projecting portions 941 of the barrier film 94 are etched. When the barrier film 94 is formed of ruthenium, the projecting portions 941 of the barrier film 94 react with the ozone gas to generate a ruthenium tetroxide gas and the projecting portions 941 are etched. More specifically, the ozone gas in the chamber 1 is decomposed into oxygen atoms and oxygen molecules on the high-temperature substrate W, the oxygen atoms react with ruthenium to generate ruthenium monoxide (RuO), and the ruthenium monoxide reacts with ozone to generate a ruthenium tetroxide gas.

In step S3, since the heater 22 heats the substrate W so that the temperature of the substrate W is a temperature suitable for etching (50° C. or higher and 200° C. or lower), the metal wiring portion 92 is etched more appropriately.

On the other hand, when the oxidizing gas acts on the upper surface of the substrate W, an oxide film is formed on the upper surface of the wiring main body 93. When the wiring main body 93 is formed of copper, a thin copper oxide film is formed on the upper surface of the wiring main body 93.

Figure 5:
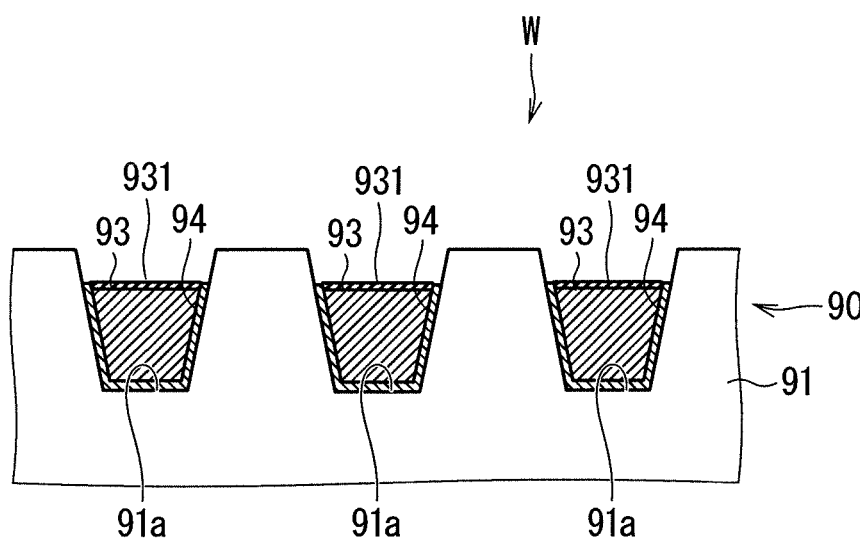
FIG. 5 is a cross-sectional view schematically illustrating an example of a configuration of the substrate after an etching step.

FIG. 5 is a cross-sectional view schematically illustrating an example of a configuration of the substrate W after step S3. As illustrated in FIG. 5, in step S3, the projecting portions 941 of the barrier film 94 are removed by the oxidizing gas, while an oxide film 931 is formed on the upper surface of the wiring main body 93.

When the projecting portions 941 are sufficiently removed, the oxidizing gas supply unit 4 terminates the supply of the oxidizing gas (step S4: etching terminating step). That is, etching terminates when the upper end of the barrier film 94 is substantially flush with the upper surface of the wiring main body 93 (here, an upper surface of the oxide film 931). As a specific example, the control unit 10 determines whether or not the elapsed time from starting the supply of the oxidizing gas has become a predetermined time or longer, and when the elapsed time has become the predetermined time or more, closes the valve 42. The predetermined time is a time required for removing the projecting portions 941, and is set in advance by, for example, by experimentation or simulation.

Next, the oxidizing gas is discharged from the chamber 1 (step S5: oxidizing gas ejecting step). For example, the inert gas supply unit 6 supplies an inert gas into the chamber 1. Specifically, the control unit 10 opens the valve 62. As a result, the inert gas is supplied into the chamber 1 from the inert gas supply source 64 through the supply pipe 61 and the supply pipe 31. Accordingly, the inert gas pushes out the oxidizing gas in the chamber 1 to the suction pipe 71. As a result, it is possible to facilitate ejection of the oxidizing gas. When the oxidizing gas is sufficiently discharged from the chamber 1, the inert gas supply unit 6 terminates the supply of the inert gas. Specifically, the control unit 10 closes the valve 62.

When a second predetermined temperature of the substrate W suitable for the later-described reducing step (step S6) differs from the first predetermined temperature, after step S4, the heater 22 heats the substrate W so that the temperature of the substrate W is the second predetermined temperature (temperature changing step). The second predetermined temperature is, for example, 100° C. or more and 300° C. or less.

Next, the reducing gas supply unit 5 supplies the reducing gas into the chamber 1 (step S6: reducing step). Specifically, the control unit 10 opens the valve 52. As a result, the reducing gas is supplied into the chamber 1 from the reducing gas supply source 54 through the supply pipe 51 and the supply pipe 31, and flows inside the chamber 1 toward the substrate W. Here, the reducing gas includes hydrogen gas.

When the reducing gas acts on the upper surface of the substrate W, the oxide film 931 is reduced and returns to one part of the wiring main body 93. For example, in a case where the oxide film 931 is copper oxide, the copper oxide reacts with the reducing gas and returns to copper (wiring main body 93).

Figure 6:
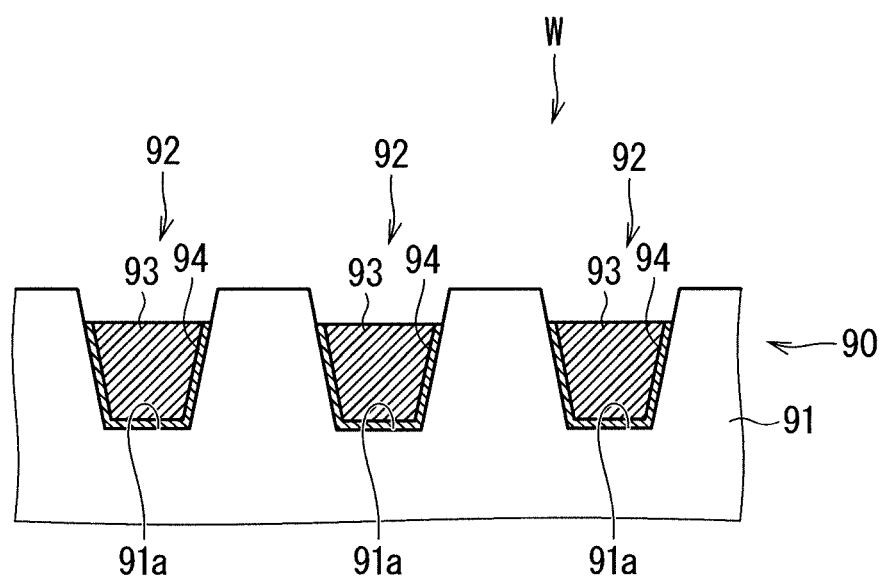
FIG. 6 is a cross-sectional view schematically illustrating an example of a configuration of the substrate after a reducing step.

FIG. 6 is a cross-sectional view schematically illustrating an example of a configuration of the substrate W after step S6. Since the oxide film 931 returns to one part of the wiring main body 93 in step S6, the oxide film 931 is not illustrated in the example of FIG. 6, and the upper end of the barrier film 94 is substantially flush with the upper surface of the wiring main body 93.

In step S6, since the heater 22 heats the substrate W so that the temperature of the substrate W is a temperature suitable for reducing the oxide film 931 (100° C. or higher and 300° C. or lower), the oxide film 931 is reduced more appropriately.

When the oxide film 931 is reduced and returns to one part of the wiring main body 93, the reducing gas supply unit 5 terminates the supply of the reducing gas (step S7: reduction terminating step). Specifically, the control unit 10 closes the valve 52. As a result, the supply of the reducing gas is terminated.

Next, the substrate W is cooled (step S8: cooling step). For example, the heater 22 completes the heating operation, and the inert gas supply unit 6 supplies the inert gas to the substrate W in the chamber 1. As a result, the inert gas flows toward the upper surface of the substrate W, and the substrate W is air-cooled.

When the temperature of the substrate W is sufficiently decreased, the substrate W is unloaded from the chamber 1 by the conveyer (step S9: unloading step). For example, the conveyer unloads the substrate W from the chamber 1 in a state where the temperature of the substrate W is 50° C. or lower, more preferably 40° C. or 30° C. or lower, and still more preferably 25° C. or lower. As a more specific example, when a predetermined cooling time has elapsed from the start of step S8, the conveyer may unload the substrate W. The predetermined cooling time is a time at which the temperature of the substrate W becomes a predetermined value (for example, 50° C.) or less, and is set in advance by experimentation or simulation. Alternatively, in a case where the temperature sensor for detecting the temperature of the substrate W is provided, the conveyer may unload the substrate W when the detection value of the temperature sensor is a predetermined value (for example, 50° C.) or less.

According to this, even if the oxygen gas is included in an external space of the chamber 1, it is possible to suppress natural oxidation of the metal wiring portion 92. As described above, according to the substrate processing apparatus 100, the oxidizing gas is supplied into the chamber 1 in a state where the upper surface of the wiring main body 93 of the substrate W and the projecting portions 941 of the barrier film 94 are exposed in the chamber 1 (step S3). Accordingly, the oxidizing gas acts on both the upper surface of the wiring main body 93 and the projecting portions 941 of the barrier film 94 in the substrate W. Consequently, while it is possible to etch the projecting portions 941 of the barrier film 94 by the oxidizing gas, the oxide film 931 is formed on the upper surface of the wiring main body 93.

Also, after the removal of the projecting portions 941, the reducing gas is supplied to the substrate W in the chamber 1 to reduce the oxide film 931 generated in step S3 (step S6). As a result, the reducing gas reacts with the oxide film 931, and the oxide film 931 can be returned to one part of the wiring main body 93.

Consequently, it is possible to remove the projecting portions 941 of the barrier film 94 while suppressing or avoiding an increase in the resistance value of the wiring main body 93.

A connection layer and a second wiring layer are formed in this order on the substrate W processed by the substrate processing apparatus 100. FIG. 7 illustrates an example of a configuration of the substrate W on which a connection layer 95 is formed. The connection layer 95 is a layer that electrically connects the second wiring layer (not illustrated) formed on the connection layer 95 with the first wiring layer 90. In the example of FIG. 7, the connection layer 95 includes a liner film 961, an insulating film 96, and a via portion 97.

The liner film 961 has an insulating property and functions as an etching stopper film of the insulating film 96. The liner film 961 is formed on the insulating film 91 and the metal wiring portion 92. The liner film 961 may be a multilayer film formed of a plurality of insulating films. For example, the liner film 961 may be a multilayer film including a nitrogen-added silicon carbide film (SiCN) and an aluminum oxide ($Al_2O_3$) film.

The insulating film 96 is also called an interlayer insulating film, and ensures insulation between the via portion 97 and the periphery. The insulating film 96 is formed on the liner film 961. Similarly to the insulating film 91, the insulating film 96 is, for example, a low dielectric film. A via hole 96a is formed in the insulating film 96 and the liner film 961. The hole 96a penetrates the insulating film 96 and the liner film 961 in the thickness direction of the substrate W. In the example of FIG. 7, the via hole 96a is formed to be misaligned with the metal wiring portion 92 in the horizontal direction. Specifically, the via hole 96a is formed over one part of the metal wiring portion 92 and one part of the insulating film 91 adjacent to this one part.

The via portion 97 is provided inside the via hole 96a. The via portion 97 includes a via main body 98 and a barrier film 99. The barrier film 99 is formed on a side surface and a bottom surface of the via hole 96a, and is thin with a thickness of about several nm. The barrier film 99 has a recessed shape corresponding to a shape of the side surface and the bottom surface of the via hole 96a, and has a step shape corresponding to a step shape of the metal wiring portion 92 and the insulating film 91 on the bottom surface of the via hole 96a.

The via main body 98 is embedded in the recessed portion of the barrier film 99. The via main body 98 is formed of a metallic material. At least any one of, for example, copper, molybdenum, cobalt, tungsten, platinum, and indium can be employed as the metallic material. When copper having a small specific resistance value is adopted as the metallic material, the resistance value of the via main body 98 can be reduced.

The barrier film 99 is formed of a metallic material capable of suppressing diffusion of the via main body 98 into the insulating film 96 and the insulating film 91. More specifically, for example, ruthenium can be employed as the metallic material.

In the example of FIG. 7, since the via portion 97 is formed to be misaligned with the metal wiring portion 92, one part of the via portion 97 is also formed on the upper surface of the insulating film 91. However, since the upper surface of the metal wiring portion 92 is lower than the upper surface of the insulating film 91, it is possible to maintain a distance between the metal wiring portion 92 adjacent to the via portion 97 (the metal wiring portion 92 at the right end in the drawing) and the via portion 97. Accordingly, it is possible to suppress or avoid a short circuit between the metal wiring portions 92 via the via portion 97.

Moreover, in the example of FIG. 7, since the projecting portions 941 of the metal wiring portion 92 have been removed, a portion where the barrier film 99 of the via portion 97 and the barrier film 94 of the metal wiring portion 92 are in contact with each other is small.

14

Figure 8:
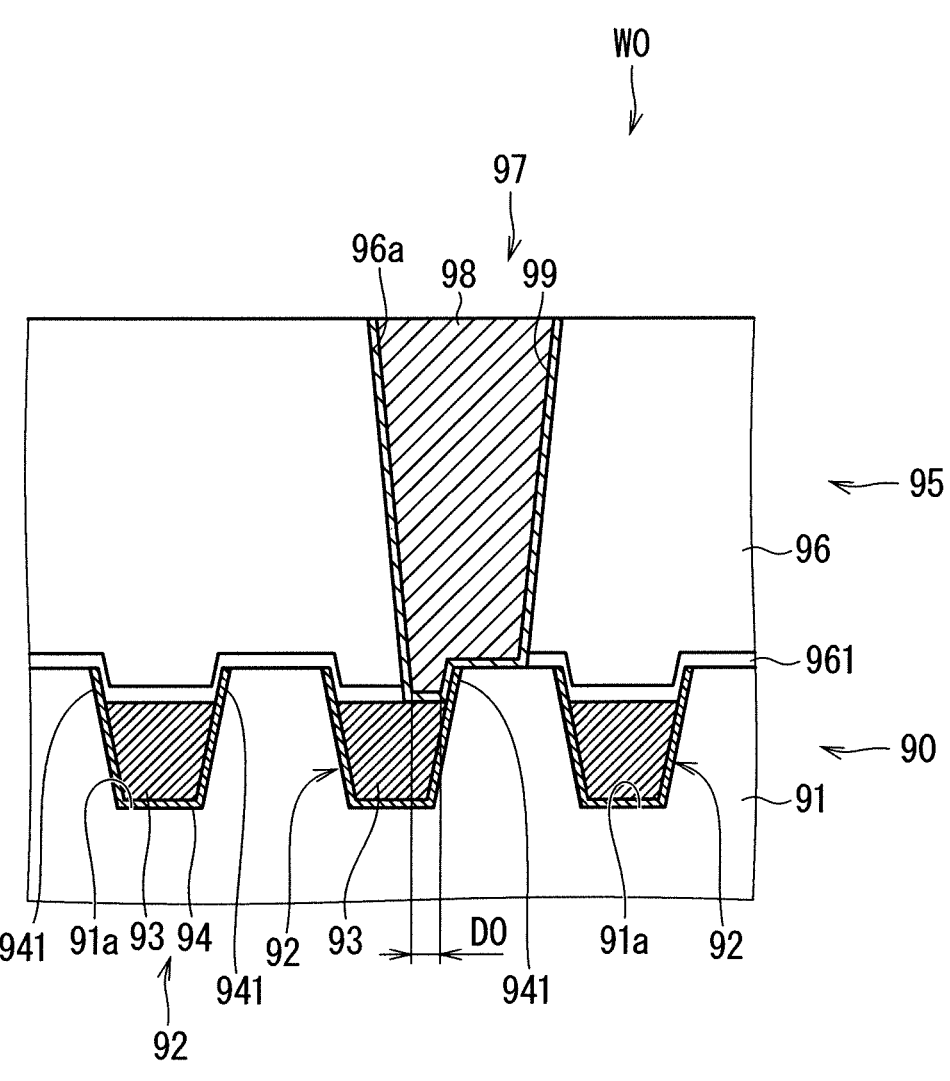
FIG. 8 is a cross-sectional view schematically illustrating an example of a configuration of a substrate according to a comparative example.

For comparison, a substrate WO in which the projecting portions 941 of the barrier film 94 are not removed will be described. FIG. 8 is a cross-sectional view schematically illustrating an example of a configuration of the substrate WO according to a comparative example. The substrate WO has the same configuration as the substrate W except for the presence/absence of the projecting portions 941. In the substrate WO, since the projecting portions 941 of the barrier film 94 are present, the barrier film 99 of the via portion 97 is formed to overlap the projecting portion 941 in a thickness direction thereof Accordingly, a width DO of a portion of a lower surface of the via main body 98 closest to the wiring main body 93 of the metal wiring portion 92 is narrowed by that of the projecting portion 941. Consequently, the metal wiring portion 92 and the via portion 97 are mutually electrically connected at a higher resistance value.

In contrast, in the substrate W, the projecting portions 941 are removed (see FIG. 7). Accordingly, a width D1 of the portion of the lower surface of the via main body 98 closest to the wiring main body 93 is widened by that of the projecting portion 941. Accordingly, the metal wiring portion 92 and the via portion 97 are mutually electrically connected at a lower resistance value. That is, by removing the projecting portions 941, the metal wiring portion 92 and the via portion 97 can be formed with a low resistance. As a result, the performance of a semiconductor device can be improved.

<Method for Removing Projecting Portions of Barrier Film>

Meanwhile, when etching the projecting portions 941 of the barrier film 94, in order to avoid oxidation of the wiring main body 93, it is also conceivable to form a temporary protective film on the upper surface of the wiring main body 93 in advance and remove the protective film after etching. Thus, since the barrier film 94 is extremely thin with a thickness of several nm, a position of the protective film is also required to have an accuracy at the same degree of several nm. It is difficult to form a protective film with such positional accuracy.

In contrast, in the present embodiment, the upper surface of the wiring main body 93 is exposed at the time of etching by the oxidizing gas (step S3), and the protective film is not formed in advance. As a result, although the oxide film 931 is formed on the upper surface of the wiring main body 93, the oxide film 931 returns to one part of the wiring main body 93 by the subsequent reducing processing (step S6). According to this, the projecting portions 941 of the barrier film 94 can be removed while omitting the difficult formation of a protective film.

Moreover, in the present embodiment, the oxide film 931 formed on the wiring main body 93 is not removed, but is reduced to restore the oxide film 931 to one part of the wiring main body 93. Accordingly, it is possible to decrease the resistance value of the wiring main body 93.

<Oxidizing Gas Ejecting Step>

In the above example, step S5 (oxidizing gas ejecting step) is performed between step S3 (etching step) and step S6 (reducing step). In this step S5, the inert gas is supplied into the chamber 1 in a state where the supply of the oxidizing gas and the reducing gas is terminated. According to this, the oxidizing gas can be quickly discharged from the chamber 1. Also, after almost all of the oxidizing gas is discharged from the chamber 1, the supply of the reducing gas is started (step S6). That is, the reducing gas is supplied into the chamber 1 after the concentration of the oxidizing gas in the chamber 1 is reduced. According to this, it is possible to suppress or avoid the reaction between the oxidizing gas and the reducing gas in the chamber 1, and it is possible to suppress or avoid the decrease in the amount of the reducing gas acting on the substrate W. Consequently, it is possible to more efficiently reduce the oxide film 931 of the wiring main body 93.

<Cooling Step>

In addition, in the above example, step S9 (unloading step) is performed after step S8 (cooling step) is performed. Accordingly, even if the oxygen gas is included outside the chamber 1, the substrate W (more specifically, the metal wiring portion 92) is hardly subjected to natural oxidation. In other words, natural oxidation of the substrate W can be suppressed in step S8.

Second Embodiment

Figure 9:
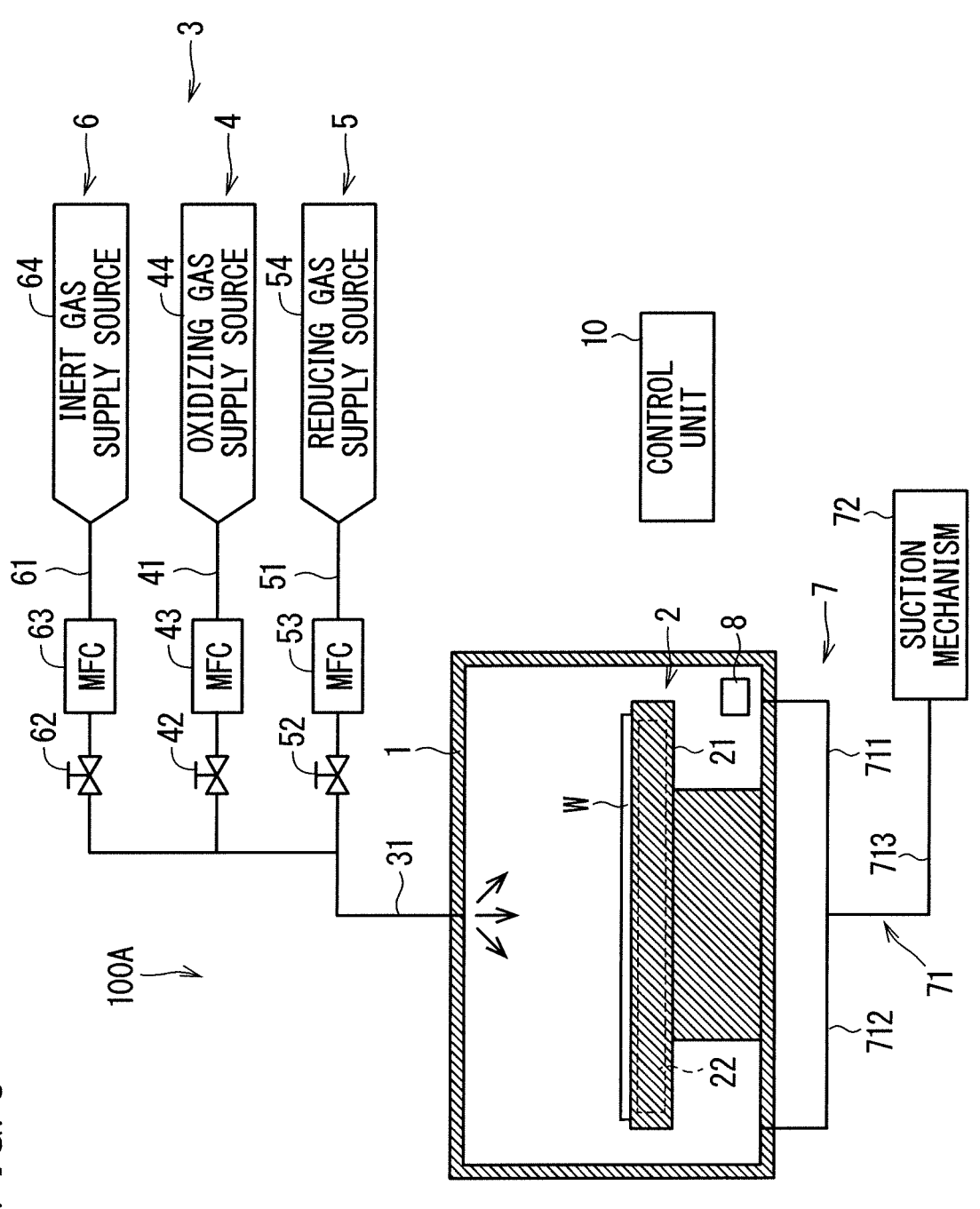
FIG. 9 is a diagram schematically illustrating an example of a configuration of a substrate processing apparatus according to a second embodiment.

FIG. 9 is a diagram schematically illustrating an example of a configuration of a substrate processing apparatus 100A according to a second embodiment. The substrate processing apparatus 100A has the same configuration as the substrate processing apparatus 100 except for the presence/absence of a gas sensor 8.

The gas sensor 8 is a sensor for detecting a generated gas generated by a reaction between the oxidizing gas and the metal wiring portion 92 (more specifically, the barrier film 94). When the barrier film 94 is ruthenium, the gas sensor 8 detects, for example, a ruthenium tetroxide gas. The gas sensor 8 is provided on a side further downstream from the substrate W held by the substrate holder 2 in the flow of gases supplied by the gas supply unit 3. The gas sensor 8 may be provided in the chamber 1, or it may be provided in the suction pipe 71. In the example of FIG. 9, the gas sensor 8 is provided near the upstream end (exhaust port) of the suction pipe 71 in the chamber 1. Since the generated gas generated on the upper surface of the substrate W flows to the exhaust port of the suction pipe 71 to be sucked into the suction pipe 71, the gas sensor 8 can effectively detect generated gas.

The gas sensor 8 detects the above generated gas and outputs an electric signal indicating the detection results to the control unit 10. The control unit 10 determines whether or not to terminate etching on the metal wiring portion 92 on the basis of an amount (for example, a concentration) of the generated gas detected by the gas sensor 8.

FIG. 10 is a graph schematically illustrating an example of a temporal change in the amount of a generated gas detected by the gas sensor 8 during etching of the projecting portions 941 of the barrier film 94. At an initial stage of the etching step (step S3), since the surface of the projecting portions 941 is exposed in the chamber 1, an exposed area of the projecting portions 941 is large. Accordingly, an area on which the oxidizing gas acts is large, and more of the generated gas is generated. Since the projecting portions 941 are gradually etched as time passes, the exposed area of the projecting portions 941 gradually gets smaller as time passes. Accordingly, the amount of the generated gases detected by the gas sensor 8 gradually decrease as time passes.

Once the projecting portions 941 are removed, the barrier film 94 is exposed only at an upper end thereof, and an exposed area thereof becomes extremely small. Even if the upper end of the barrier film 94 is removed by the oxidizing gas, since the exposed area of the barrier film 94 hardly changes, the concentration of the generated gas is substantially constant regardless of time passing.

In this way, the amount of the generated gas detected by the gas sensor 8 has a correlative relationship with the amount of etching on the barrier film 94. Therefore, the control unit 10 determines whether or not to terminate the etching, that is, whether or not to terminate the supply of the oxidizing gas, based on the amount of the generated gas detected by the gas sensor 8.

FIG. 11 is a flowchart illustrating an example of a specific operation of the etching step (step S3). In the etching step, first, the oxidizing gas supply unit 4 starts the supply of the oxidizing gas (step S301). Specifically, the control unit 10 opens the valve 42. Next, the gas sensor 8 detects a generated gas (for example, ruthenium tetroxide) (step S302: detecting step).

Next, the control unit 10 determines whether or not the amount of the generated gas detected by the gas sensor 8 satisfies a terminating condition (step S303: determination step). Although the terminating condition is not particularly limited, for example, a first condition, in which the amount of the generated gas detected by the gas sensor 8 is equal to or less than a predetermined reference amount Rref, may be employed. The reference amount Rref is, for example, a value equivalent to the amount of the generated gas generated when the projecting portions 941 are removed, and is set in advance by experimentation or simulation.

When the terminating condition is not satisfied, step S302 is performed once again. When the terminating condition is satisfied, the etching terminating step (step S4) is performed.

As described above, the substrate processing apparatus 100A terminates etching based on the generated gas detected by the gas sensor 8. Accordingly, it is possible to remove the projecting portions 941 more reliably, and it is also possible to suppress overetching of the barrier film 94 more reliably.

Note that, as can be understood from FIG. 10, when the projecting portions 941 of the barrier film 94 are removed, the amount of the generated gas is substantially constant with respect to time. Accordingly, a second condition in which a temporal change rate of the amount of the generated gas is equal to or less than a predetermined reference change rate may be employed as the terminating condition. The reference change rate is set in advance by, for example, experimentation or simulation.

Alternatively, both the first condition and the second condition may be employed as the terminating condition. That is, the control unit 10 may determine that the terminating condition is satisfied when both the first condition and the second condition are satisfied. When both the first condition and the second condition are employed, the reference amount Rref is, for example, a larger value than the amount of the generated gas generated when the projecting portions 941 are removed, and may be set in advance by experimentation or simulation. By employing both the first condition and the second condition, etching can be completed more appropriately. For example, in FIG. 10, even if the temporal change rate is small at the initial stage of the etching step, etching is not terminated as the first condition is not satisfied. In addition, since both the first condition and the second condition are satisfied when the projecting portions 941 are removed, it is possible to suppress overetching more reliably.

Third Embodiment

An example of a configuration of the substrate processing apparatus 100 according to the third embodiment is the same as that of the first or second embodiment. In the third embodiment, a specific example of the etching step (step S3) differs from those of the first and second embodiments.

Figure 12:
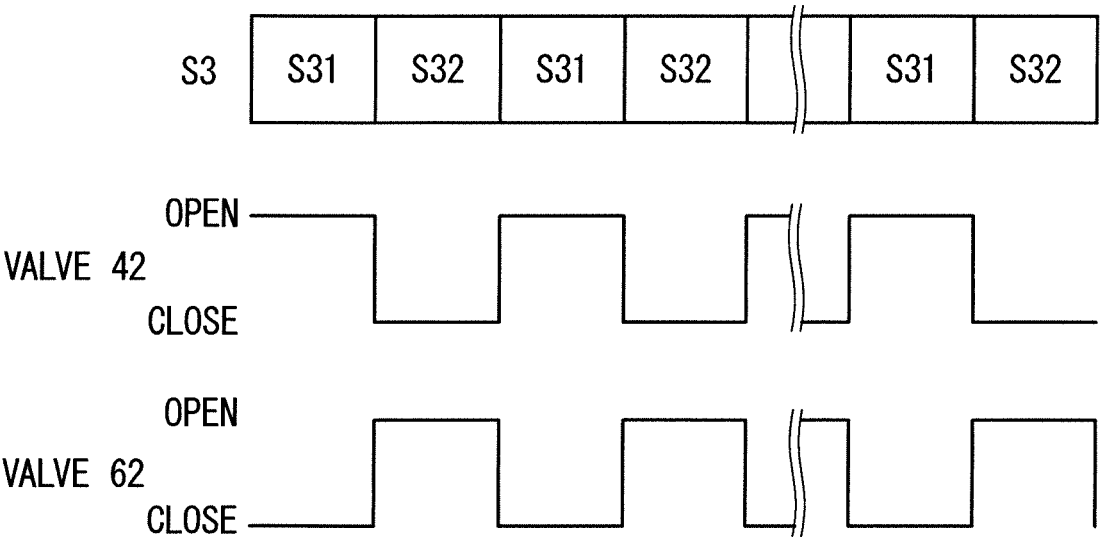
FIG. 12 is a timing chart illustrating an example of the etching step.

FIG. 12 is a timing chart illustrating an example of an etching step according to the third embodiment. In the etching step (step S3), the substrate processing apparatus 100 alternately repeats a first step S31 of supplying the oxidizing gas into the chamber 1 and a second step S32 of supplying the inert gas into the chamber 1. Specifically, the control unit 10 opens the valve 42 and closes the valve 62 in the first step S31. In addition, the control unit 10 closes the valve 42 and opens the valve 62 in the second step S32.

In the first step S31, since the oxidizing gas is supplied into the chamber 1, the oxidizing gas reacts with the metal wiring portion 92 (specifically, the projecting portions 941) of the substrate W, thereby enabling etching of the metal wiring portion 92. In the second step S32 following the first step S31, the inert gas is supplied into the chamber 1. As a result, the concentration of the oxidizing gas becomes uneven in the chamber 1. Specifically, the oxygen concentration decreases in an upper portion of the chamber 1. Accordingly, the oxidizing gas in the vicinity of the upper surface of the substrate W is quickly separated from the upper surface of the substrate W due to concentration diffusion.

In the subsequent first step S31, a fresh oxidizing gas is once again supplied into the chamber 1. Accordingly, the old oxidizing gas in the vicinity of the upper surface of the substrate W is easily replaced with the new oxidizing gas, and the new oxidizing gas is likely to act on the upper surface of the substrate W. In the subsequent second step S32, the inert gas is once again supplied into the chamber 1, and the old oxidizing gas is quickly separated from the vicinity of the substrate W.

As described above, by alternately repeating the first step S31 and the second step S32, etching can be performed while quickly replacing the old oxidizing gas of the substrate W with the new oxidizing gas. As a result, an etching speed of the substrate W by the oxidizing gas can be increased.

Fourth Embodiment

In the first to third embodiments, the metal wiring portion 92 formed on the substrate W includes two mutually different kinds of metal films (here, the wiring main body 93 and the barrier film 94), in which one metal film (here, the barrier film 94) is etched by the oxidizing gas, while the other metal film (here, the wiring main body 93) forms the oxide film by the oxidizing gas.

However, the metal wiring portion 92 may be formed of at least one kind of metal film. When the metal wiring portion 92 is formed of one kind of metal film, a material that can partially form an oxide film while being removed by a reaction with the oxidizing gas is employed as the material of the metal wiring portion 92. For example, the metal wiring portion 92 may be formed of a ruthenium metal film. Ruthenium generates a ruthenium tetroxide ($RuO_4$) gas by the oxidizing gas, and it may also partially generate solid ruthenium dioxide ($RuO_2$). Accordingly, as long as the ruthenium metal film is etched by the oxidizing gas, an oxide film (ruthenium dioxide) may partially remain on the surface thereof.

Figure 13:
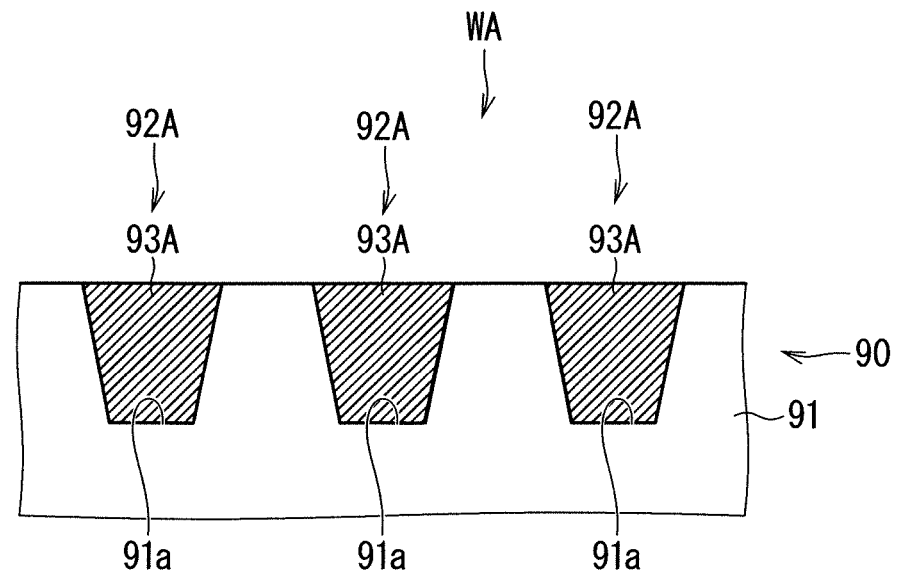
FIG. 13 is a cross-sectional view schematically illustrating another example of a configuration of the substrate.

FIG. 13 is a cross-sectional view schematically illustrating an example of a configuration of a substrate WA. The substrate WA has the same configuration as the substrate W except for the configuration of the metal wiring portion 92. In the substrate WA, a metal wiring portion 92A is provided instead of the metal wiring portion 92. In the example of FIG. 13, the metal wiring portion 92A is embedded in the trench 91a of the insulating film 91. As illustrated in FIG. 13, the metal wiring portion 92A may be formed of a single metal film 93A. The metal film 93A is formed of a metallic material (for example, ruthenium) that generates an oxide film while being etched by the oxidizing gas.

The metal film 93A is provided in the trench 91a of the insulating film 91, and the upper surface thereof is substantially flush with the upper surface of the insulating film 91.

An example of the operation of the substrate processing apparatus 100 is similar to that in FIG. 4. However, in step S1 (loading step), the substrate WA in FIG. 13 is loaded. Accordingly, the substrate WA is held by the substrate holder 2. At this time, the upper surface of the insulating film 91 and an upper surface of the metal film 93A of the substrate WA are exposed in the chamber 1.

In step S2 (reduced-pressure heating step), a temperature of the substrate WA is adjusted while the pressure in the chamber 1 is adjusted as necessary. In the subsequent step S3 (etching step), the oxidizing gas acts on the upper surface of the metal film 93A, thereby etching the metal film 93A. Specifically, the oxidizing gas reacts with the metal film 93A to generate a ruthenium tetroxide gas, thereby etching the metal film 93A. As a result, the upper surface of the metal film 93A retreats further than the upper surface of the insulating film 91. In addition, a solid ruthenium dioxide may also be generated by the reaction between the oxidizing gas and the metal film 93A.

When the metal film 93A is sufficiently etched, step S4 (etching terminating step) is performed. Since a solid ruthenium dioxide may also be generated in step S3, ruthenium dioxide may remain on the upper surface of the metal film 93A when step S4 is complete.

Therefore, for example, after step S5 (oxidizing gas ejecting step) has passed, step S6 (reducing step) is performed. In step S6, since the reducing gas acts on the upper surface of the substrate W, ruthenium dioxide on the upper surface of the metal film 93A is reduced and returns to ruthenium. That is, oxide on the upper surface of the metal film 93A can be restored to one part of the metal film 93A.

As described above, according to the substrate processing apparatus 100, it is possible to adjust a shape of the metal film 93A by etching the metal film 93A by the oxidizing gas, and moreover, it is possible to reduce oxide on the surface of the metal film 93A that can be generated by the oxidizing gas to restore to one part of the metal film 93A. Accordingly, it is possible to decrease a resistance value of the metal film 93A.

As described above, while the substrate processing apparatuses 100, 100A and the wiring forming method have been described in detail, the above description is illustrative in all aspects, and the substrate processing apparatuses 100,100A and the wiring forming method are not limited thereto. It is understood that countless modifications, which are not illustrated, can be assumed without departing from the scope of the present disclosure. The configurations described in the above embodiments and modifications can be combined or omitted as appropriate unless they are mutually inconsistent.

For example, the oxidizing gas is not limited to the ozone gas, and gases such as a halogenated oxygen gas, a nitrogen oxide gas, or the like may be employed. In addition, the oxidizing gas supply unit 4 may supply a gas including oxygen and an oxidizing gas such as a nitrogen oxide gas or the like to the substrate W after exciting the gas by ultraviolet rays or plasma. As a specific example, a mixed gas of an oxygen gas and a chlorine gas may be employed as the oxidizing gas, and the oxidizing gas supply unit 4 may supply the mixed gas to the substrate W in the chamber 1 after converting the gas into plasma. In addition, the reducing gas is not limited to a hydrogen gas, and may be, for example, another gas such as carbon monoxide or the like.

EXPLANATION OF REFERENCE SIGNS

1: chamber
2: substrate holder
4: oxidizing gas supply unit
5: reducing gas supply unit
8: gas sensor
92, 92A: metal wiring portion
93: wiring main body
93A: metal film
94: barrier film
941: projecting portion
2: substrate holder
4: oxidizing gas supply unit
5: reducing gas supply unit
S1: loading step
S3: etching step (step)
S301: detecting step
S302: determination step
S31: first step
S32: second step
S5: oxidizing gas ejecting step (step)
S6: reducing step (step)
S7: cooling step (step)
S8: unloading step (step)
W: substrate

The invention claimed is:

1. A wiring forming method comprising:

loading a substrate having a metal wiring portion formed on said substrate into a chamber;

supplying an oxidizing gas to said substrate to etch one part of said metal wiring portion; and supplying a reducing gas to said substrate to reduce an oxide film of said metal wiring portion formed by supplying said oxidizing gas, wherein said metal wiring portion comprises:

a wiring main body positioned in a trench of an insulating film in said substrate; and a barrier film provided between said wiring main body and said insulating film;

and wherein an upper surface of the wiring main body is recessed from an upper surface of the barrier film;

in supplying said oxidizing gas, etching a projecting portion of said barrier film projecting beyond an upper surface of said wiring main body; and in supplying said reducing gas, reducing said oxide film formed on said wiring main body by said supplying said oxidizing gas.

2. The wiring forming method according to claim 1, wherein said barrier film includes ruthenium.

3. The wiring forming method according to claim 1, wherein said wiring main body includes at least any one of copper, molybdenum, cobalt, tungsten, platinum, and indium.

4. The wiring forming method according to claim 1, wherein further comprises:

detecting a generated gas generated by supplying said oxidizing gas by a gas sensor, said generated gas generated by a reaction between said oxidizing gas and said metal wiring portion; and determining whether to terminate supplying said oxidizing gas based on a detection value of said gas sensor.

5. The wiring forming method according to claim 1, further comprising:

supplying an inert gas into said chamber to discharge said oxidizing gas from said chamber, supplying said inert gas is performed between supplying said oxidizing gas and supplying said reducing gas.

6. The wiring forming method according to claim 1, wherein in supplying said oxidizing gas, supplying said oxidizing gas and supplying the inert gas are alternately repeated.

7. The wiring forming method according to claim 1, wherein in supplying said oxidizing gas, said substrate is heated so that a temperature of said substrate is 50 degrees Celsius or more and 200 degrees Celsius or less.

8. The wiring forming method according to claim 1, wherein in supplying said reducing gas, said substrate is heated so that a temperature of said substrate is 100 degrees Celsius or more and 300 degrees Celsius or less.

9. The wiring forming method according to claim 1, further comprising:

cooling said substrate after supplying said reducing gas; and unloading said substrate from said chamber after cooling said substrate.

10. A substrate processing apparatus comprising:

a chamber;

a substrate holder provided in said chamber that holds a substrate having a metal wiring portion formed on said substrate;

an oxidizing gas supply unit that supplies an oxidizing gas to said substrate in said chamber to etch one part of said metal wiring portion;

a reducing gas supply unit that supplies a reducing gas to said substrate to reduce an oxide film of said metal wiring portion formed by said oxidizing gas; and a controller performing operations according to claim 1.

* * * * *